United States Patent
Murata et al.

[11] Patent Number: 5,998,234
[45] Date of Patent: Dec. 7, 1999

[54] METHOD OF PRODUCING SEMICONDUCTOR DEVICE BY DICING

[75] Inventors: Minoru Murata, Kariya; Kenichi Ao, Tokai; Yasutoshi Suzuki, Okazaki; Seiichiro Ishiou, Handa, all of Japan

[73] Assignee: Denso Corporation, Kariya, Japan

[21] Appl. No.: 08/825,456

[22] Filed: Mar. 28, 1997

[30] Foreign Application Priority Data

Mar. 29, 1996 [JP] Japan ................................. 8-076316
Feb. 19, 1997 [JP] Japan ................................. 9-035078

[51] Int. Cl.$^6$ .......................... H01L 21/00; H01L 21/44; H01L 21/48; H01L 21/50
[52] U.S. Cl. .............................. 438/53; 438/68; 438/113; 438/464
[58] Field of Search ................... 438/460, 464, 438/50, 53, 113, 68

[56] References Cited

U.S. PATENT DOCUMENTS

| | | | |
|---|---|---|---|
| 4,080,245 | 3/1978 | Yamanaka et al. | 156/647 |
| 5,000,811 | 3/1991 | Campanelli | 156/264 |
| 5,196,378 | 3/1993 | Bean et al. | 437/226 |
| 5,219,796 | 6/1993 | Quinn et al. | 438/68 |
| 5,421,956 | 6/1995 | Koga . | |
| 5,531,002 | 7/1996 | Okada | 29/25.41 |

FOREIGN PATENT DOCUMENTS

| | | |
|---|---|---|
| 60-004010 | 1/1985 | Japan . |
| 2-305450 | 12/1990 | Japan . |
| 4-107155 | 4/1992 | Japan . |
| 4-085750 | 7/1992 | Japan . |

OTHER PUBLICATIONS

Journal of Nippondenso Technical Disclosure No. 104–021, Published on Sep. 15, 1995 (w/ abstract).

*Primary Examiner*—Brian Dutton
*Attorney, Agent, or Firm*—Pillsbury Madison & Sutro LLP

[57] ABSTRACT

On a back face of a silicon wafer before dicing, tapered grooves having sloped side walls are formed by anisotropic etching along with thin portions. Strain gauges are formed on each thin portion, thereby forming a sensor chip on the silicon wafer. The back face of the silicon wafer is attached to a self-adhesive seat. Thereafter, the silicon wafer is cut along the grooves by a dicing blade to divide it into each sensor chip. In dicing, the side faces of the dicing blade cut the sloped side walls of the tapered grooves. As a result, the silicon wafer is diced into individual sensor chip having no cracks and chippings.

32 Claims, 16 Drawing Sheets

METHOD OF PRODUCING SEMICONDUCTOR DEVICE BY DICING

CROSS REFERENCE TO RELATED APPLICATIONS

This application is based upon and claims the benefit of priority of the prior Japanese Patent Applications No. 8-76316 filed on Mar. 29, 1996, and No. 9-35078 filed on Feb. 19, 1997, the contents of which are incorporated herein by reference.

BACKGROUND OF THE INVENTION

1. Field of the Invention

The present invention relates to a method of producing a semiconductor device such as a semiconductor dynamic sensor for detecting an amount of acceleration, pressure or the like.

2. Related Arts

A semiconductor acceleration sensor is, as shown in FIGS. 31 and 32, conventionally composed of a rectangular plate-like silicon substrate 61, through grooves 62 formed on the silicon substrate 61 (a silicon chip), a rectangular frame (a thick portion) 63 formed at an outer side of the through grooves 62, and a rectangular weight (a thick portion) 64 formed at an inner side of the through grooves 62. The frame 63 and the weight 64 are connected by thin beams 65 to 68, and strain gauges 69 to 72 for detecting an amount of acceleration are formed on the beams 65 to 68, respectively. The silicon substrate 61 is bonded to a ceramic substrate 73 by utilizing adhesives 74 after dicing. That is, the lower face of the frame 63 and the upper face of the ceramic substrate 73 are bonded to each other through the adhesives 74.

In processes of manufacturing the acceleration sensor, as shown in FIGS. 33 and 34, firstly, thin portions 75 on which strain gauges are formed are formed on a silicon wafer 76. Each thin portion 75 corresponds an area where beams and through grooves are to be formed to form one sensor chip. The silicon wafer 76 is attached to a self-adhesive sheet 77 for dicing, and then, it is cut to be divided into sensor chips along dicing lines Ld by a dicing blade 80.

On the other hand, as shown in FIGS. 35 and 36, a semiconductor pressure sensor is conventionally composed of a square plate-like silicon substrate 90, a recess 91 formed on the silicon substrate 90, and a diaphragm 92 formed at the bottom of the recess 91. On the diaphragm 92 are formed strain gauges 93 to 96 for detecting an amount of pressure applied to the diaphragm 92. Further, the silicon substrate 90 is joined to a glass base 97. On the back face of the glass base 97, a vapor deposition layer 98 made of metal is formed, and is joined to a metallic stem 99 through a solder layer 100.

In processes of manufacturing the pressure sensor, diaphragms 92, each of which forms one pressure sensor, are formed on a silicon wafer 101. As shown in FIG. 37, the silicon wafer 101 is bonded to a glass plate 102 for forming the glass base 97. The back face of the glass plate 102 is attached to a self adhesive sheet 104 through a vapor deposition layer 103 made of metal. Thereafter, the silicon wafer 101 and the glass plate 102 are cut into sensor chips along dicing lines by a dicing blade 105.

In the dicing process of the semiconductor acceleration sensor, however, cracks 78 and chippings 79 of the silicon wafer 76 occur at edge portions cut by the dicing blade 80 as shown in FIG. 33. Therefore, as shown in FIG. 38, thus obtained sensor chip 81 has the cracks 78 and the chippings 79 on outer circumferential faces (dicing portions) thereof. Especially in the semiconductor acceleration sensor, as shown in FIG. 32, a width $W_F$ of the frame 63 has been becoming narrow to miniaturize the sensor chip in recent years. Accordingly, the frame 63 becomes liable to be broken due to the cracks 78 and the chippings 79, and inferior adhesion of the frame 63 becomes liable to occur when the sensor chip is mounted.

Further, in the dicing process of the semiconductor pressure sensor, as shown in FIG. 37, the dicing blade 105 used for thick plates such as the glass plate 102 is liable to generate big chippings 106 compared to the other dicing blade which is used for thin plates such as a silicon wafer. In this case, an exfoliation of the vapor deposition layer 103 formed on the back face of the glass plate 102 accompanies the chippings 106, thereby resulting in inferior junction between the glass base 97 and the metallic stem 99 in the sensor chip shown in FIG. 36.

SUMMARY OF THE INVENTION

The present invention has been made in view of the above-mentioned problems and an object of the present invention is to provide a method of producing a semiconductor device utilizing a dicing process. More particularly, the object of the present invention is to provide a method capable of preventing cracks and chippings in the dicing process for producing the semiconductor device.

According to the present invention, firstly, grooves having sloped side walls are formed on a back face of a semiconductor wafer along dicing lines to be cut by dicing. Thereafter, the back face of the semiconductor wafer is attached to a self-adhesive sheet, and the semiconductor wafer is cut along the grooves from a side opposite to the back face of the semiconductor wafer by a dicing blade so that side faces of the dicing blade pass the sloped side walls of the grooves, respectively.

Accordingly, the semiconductor wafer is divided into each semiconductor device.

As a result, because the side faces of the dicing blade pass the sloped side walls of the grooves, cracks and chippings of the semiconductor wafer become less susceptible to occur at edge portions cut by the dicing blade.

Preferably, the semiconductor device is a semiconductor sensor such as an acceleration sensor or the like, which is composed of a substrate, a thin portion formed on the substrate, and strain gauges formed on the thin portion.

In this case, the grooves and the thin portion can be formed on the semiconductor wafer by an anisotropic etching process at the same time. Therefore, the process of producing the semiconductor device becomes simple. In a case that a (100) silicon single-crystal silicon substrate wafer is adopted as the semiconductor wafer, each of the grooves has {111} planes of silicon as its sloped is side walls.

Further, even if the semiconductor device has a frame of which a width is smaller than 1 mm, as mentioned above, the cracks and chippings of the semiconductor wafer can be prevented at the edge portions cut by the dicing blade in the dicing process. Therefore, the frame can be prevented from being broken under its handling when the semiconductor device is mounted. Further, inferior adhesion of the frame can be prevented.

The present invention may be applied to another semiconductor device having a base and a semiconductor substrate joined to the base. In this case, firstly, grooves having sloped side walls are formed on a back face of a plate member used for forming the base. Next, a semiconductor wafer used for forming the semiconductor substrate is joined to the plate member on an opposite side to the back face of the plate member. Thereafter, the semiconductor wafer joined to the plate member is cut by a dicing blade along the grooves so that the side faces of the dicing blade pass the sloped side walls of the grooves. Accordingly, cracks and chippings of the plate member can be prevented at the edge portions cut by the dicing blade.

Even if a metallic layer is formed on the back face of the plate member, because the cracks and chippings of the plate member can be prevented, an exfoliation of the metallic layer from the plate member does not occur. Therefore, in a case that the plate member (base) is bonded to a metallic base through the metallic layer by soldering, a strength of junction between the plate member and the metallic base can be enhanced.

In all cases, it is desirable that each of the grooves formed on the semiconductor wafer has a triangular cross-sectional shape, a half-round cross-sectional shape or the like.

Other objects and features of the present invention will become more readily apparent from a better understanding of the preferred embodiments described below with reference to the following drawings.

DETAILED DESCRIPTION OF THE PREFERRED EMBODIMENTS

Embodiments according to the present invention will be described hereinunder with reference to the drawings.

In a first embodiment, a semiconductor acceleration sensor utilizing the present invention will be explained.

Figure 1:
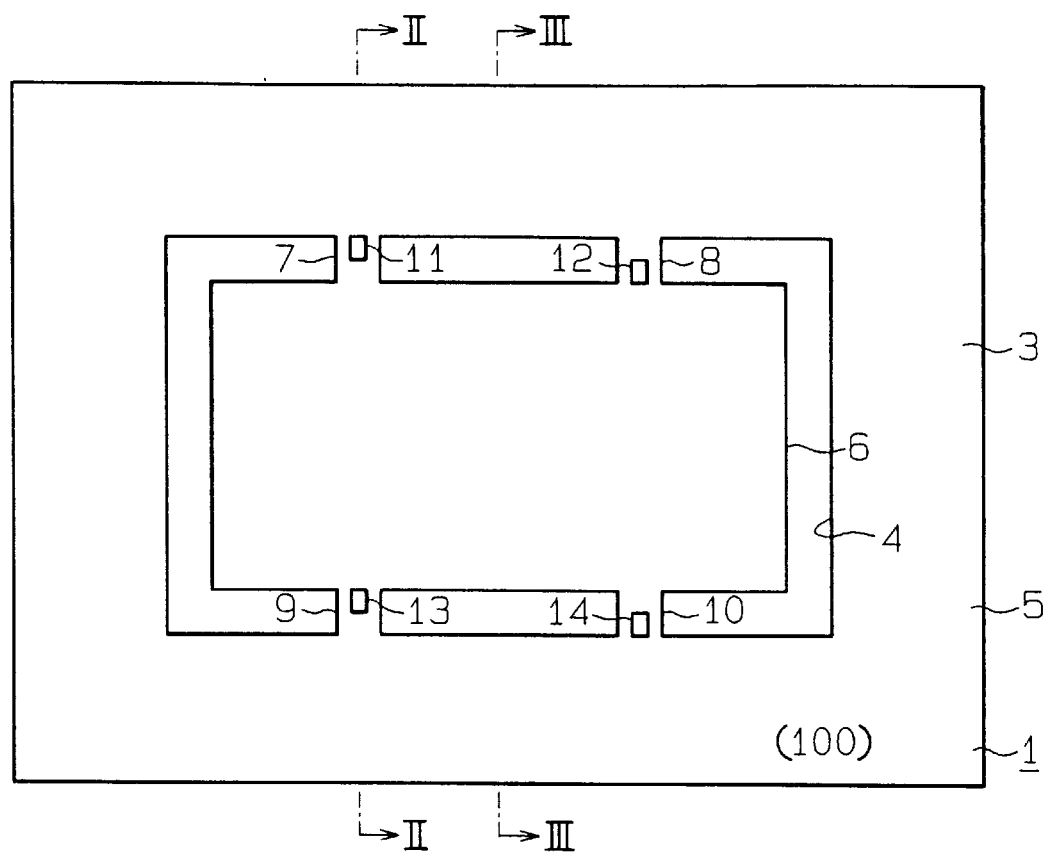
FIG. 1 is a plan view showing a semiconductor acceleration sensor in a first embodiment according to the present invention.
Figure 2:
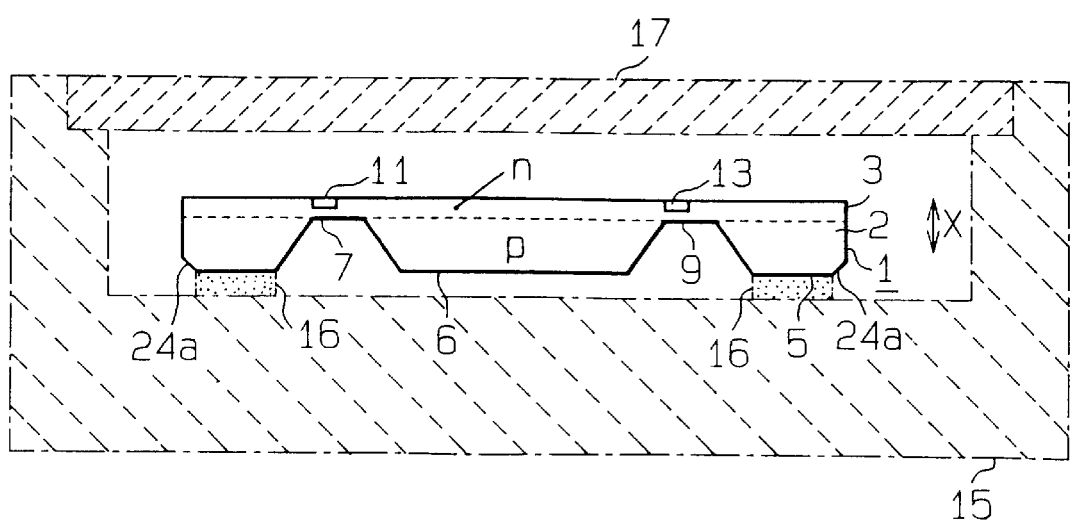
FIG. 2 is a cross-sectional view taken along the II—II line in FIG. 1 showing the acceleration sensor.
Figure 3:
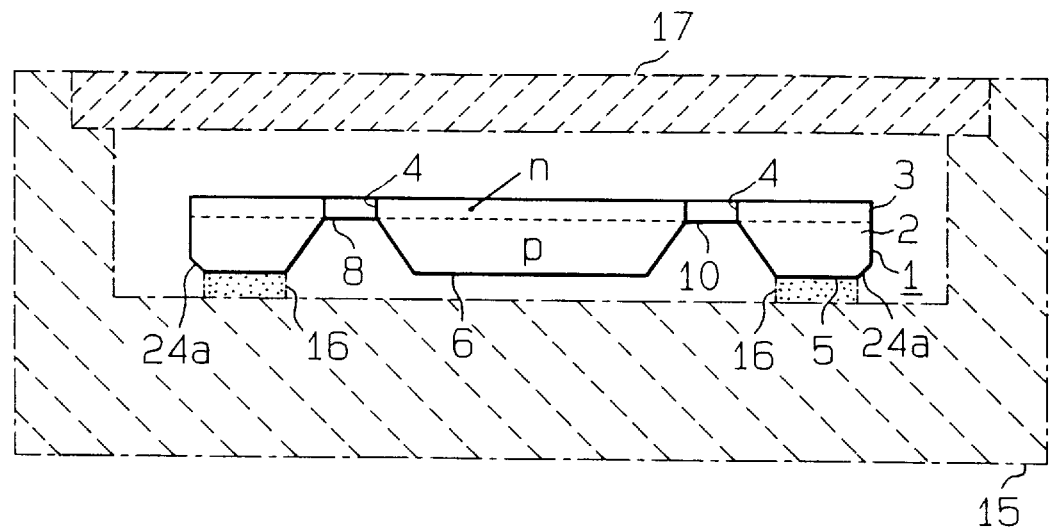
FIG. 3 is a cross-sectional view taken along the III—III line in FIG. 1 showing the acceleration sensor.

As shown in FIGS. 1 to 3, the semiconductor acceleration sensor has a rectangular plate-like silicon single-crystal substrate (a silicon chip) 1 composed of a p-type silicon substrate 2 and an n-type epitaxial layer 3 formed on the p-type silicon substrate 2. The silicon substrate 1 used as a semiconductor substrate has through grooves 4 penetrating the silicon substrate 1, a rectangular frame (a thick portion) 5 formed at an outer side of the through grooves 4, and a rectangular weight (a thick portion) 6 formed at an inner side of the through grooves 4. The frame 5 and the weight 6 are connected by thin beams (thin portions) 7 to 10.

Each of the beams 7 to 10 is composed of the n-type epitaxial layer 3, and strain gauges 11 to 14 are formed on the beams 7 to 10, respectively. Each of the strain gauges 11 to 14 is a p-type impurity diffusion layer (a piezoresistance layer) of which a value of resistance changes in response to an amount of acceleration applied to the acceleration sensor.

The silicon substrate 1 is joined to a ceramic substrate 15 used as a base through adhesives 16. That is, the lower face of the frame 5 is joined to the upper face of the ceramic substrate 15. In this case, the weight 6 is separated from the ceramic substrate 15 by a constant distance, and the distance is determined by a thickness of the adhesives 16.

Here, it is desirable that the adhesives 16 has large elastic modulus not to transfer stress from the ceramic substrate 15 to the silicon substrate 1. As the adhesives 16, for example, adhesives of silicone family of which Young's modulus is approximately 1 MPa can be adopted.

The ceramic substrate 15 has a box-like shape having an opening, and the opening is closed by a lid member 17 made of ceramic.

In a case that acceleration is applied to the silicon substrate 1 in a perpendicular direction with respect to the silicon substrate 1 indicated by an arrow X (a direction X) in FIG. 2, the weight 6 is displaced in the direction X, generating strains in the beams 7 to 10. The values of resistance of the strain gauges 11 to 14 change in response to the amounts of strain generated in the beams 7 to 10, so that the amount of acceleration applied to the substrate 1 in the direction X is detected.

Figure 4:
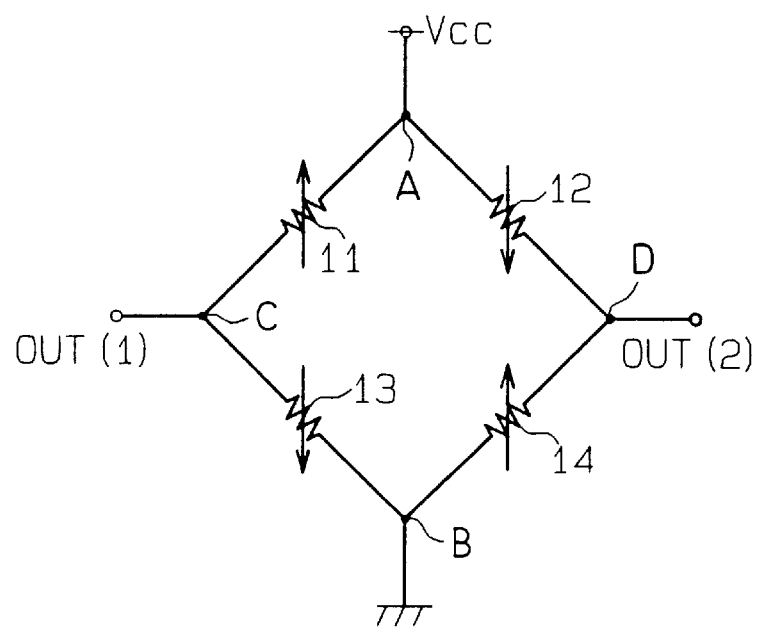
FIG. 4 is a circuit diagram showing an electrical connection of the acceleration sensor.

FIG. 4 shows an electrical connection of the semiconductor acceleration sensor. The strain gauges 11 to 14 form a full-bridge circuit. A source voltage $V_{cc}$ is applied to a connection point A between the strain gauges 11 and 12, while a connection point B between the strain gauges 13 and 14 is grounded. Connection points C and D between the strain gauges 11 and 13, and 12 and 14 function as output terminals. A potential difference between the connection points C and D is output as an electric signal in accordance with the amount of acceleration.

Next, processes of manufacturing the semiconductor acceleration sensor employing the above mentioned configuration will be explained by referring to FIGS. 5 to 8.

Figure 5:
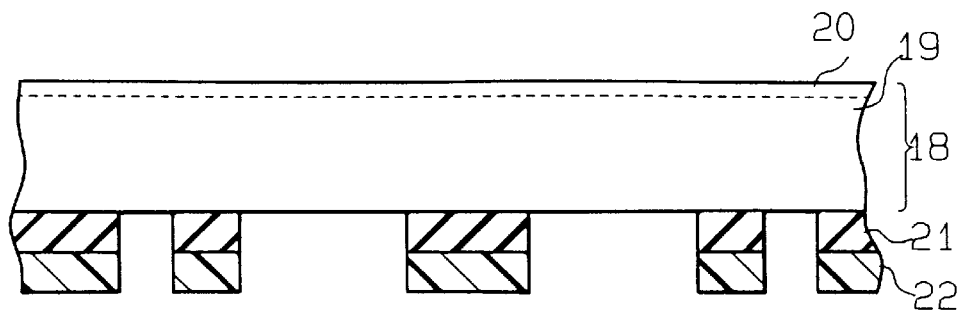
FIGS. 5 to 10 are cross-sectional views of the acceleration sensor for explaining processes of manufacturing the same.

First, as shown in FIG. 5, a (100) silicon wafer 18 is prepared as a semiconductor wafer, which is composed of a p-type silicon wafer 19 and an n-type epitaxial layer 20 formed on the p-type silicon wafer 19.

Figure 8:
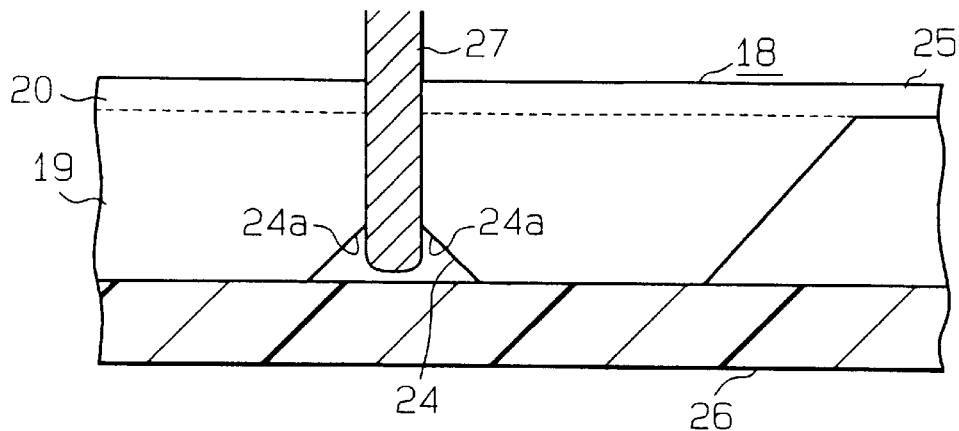

A $p^+$ diffusion layer is formed at predetermined areas of the surface layer of the n-type epitaxial layer 20 as piezoresistance areas which form the strain gauges 11 to 14, and aluminum wiring is performed on the $p^+$ diffusion layer. As opposed to this, the lower face (back face) of the silicon wafer 18 function as a surface which is to be bonded to a self adhesive sheet 26 for dicing as shown in FIG. 8.

On the back face of the silicon wafer 18, a silicon nitride (SiN) layer 21, which functions as an etching mask, is deposited, and then, a resist layer 22 is coated on the SiN layer 21. Thereafter, exposure and developing processes are performed on the resist layer 22 so that the resist layer 22 remains only at specific areas on the SiN layer 21. Further, the SiN layer 21 on which the resist layer 22 does not remain is removed to be patterned by a dry etching process or the like as shown in FIG. 5.

Figure 6:
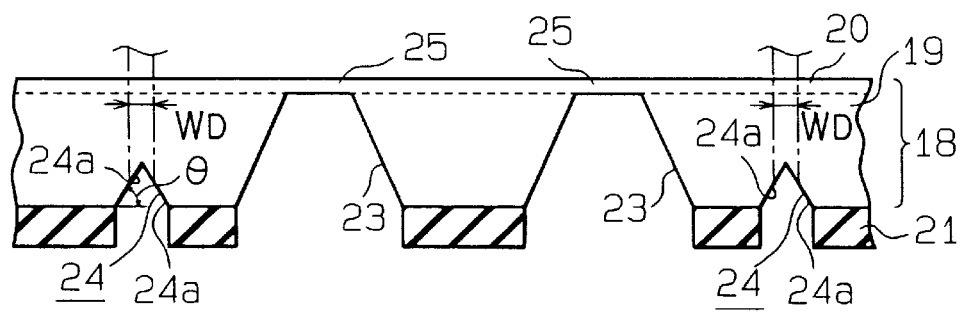
Figure 7:
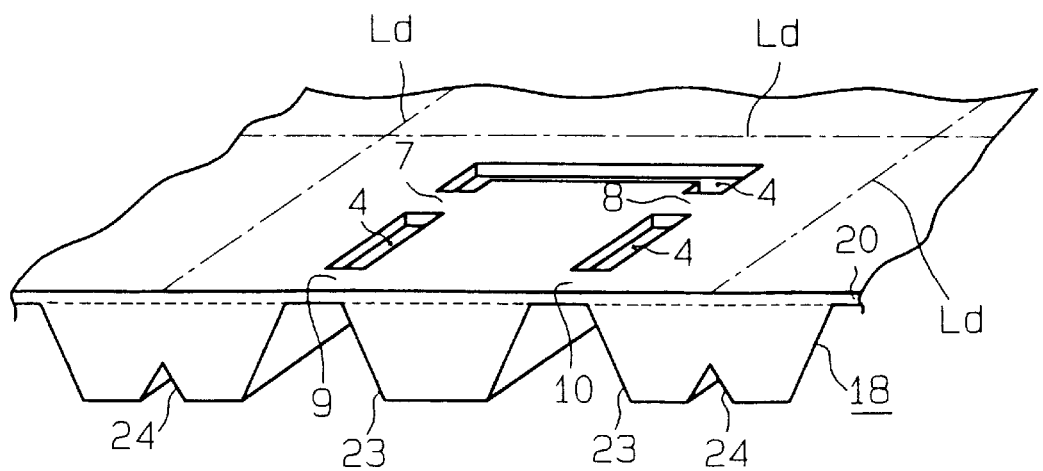

Successively, as shown in FIG. 6, after the resist layer 22 is removed, the p-type silicon wafer 19 is etched by an anisotropic etching process through the SiN layer 21 functioning as the etching mask. The anisotropic etching process is an electrochemical etching process performed in a potassium hydroxide (KOH) aqueous solution. As a result, recesses 23 for forming thin portions 25 and tapered grooves 24 are formed at the same time. In more detail, the etching process is stopped at an interface (a p-n junction portion) between the p-type silicon wafer 19 and the n-type epitaxial layer 20, so that the thin portions 25 composed of the n-type epitaxial layer 20 are formed at the bottom of the recesses 23, respectively. The tapered grooves 24 are formed to correspond to the dicing lines Ld as shown in FIG. 7. In the tapered grooves 24, {111} planes of silicon, an etching rate of which is low, are exposed on sloped side walls 24a, and make a taper-angle θ being approximately 54.7° therebetween as shown in FIG. 6.

In this case, because the silicon wafer 18 has a (100) plane on its surface, the recesses 23 for forming the thin portions 25 can be formed along with the tapered grooves 24 having the {111} planes by the anisotropic etching process.

Thereafter, the SiN layer 21 is removed. Further, as shown in FIG. 7, the thin portions 25 of the silicon wafer 18 are etched from the surface of the n-type epitaxial layer 20, thereby forming the through grooves 4 and the beams 7 to 10.

In this way, the tapered grooves 24 are formed on the back face of the silicon wafer 18 to correspond to the dicing lines Ld. Here, the back face of the silicon wafer 18 is a surface to be attached to a self-adhesive sheet 26 for dicing. Each width of the tapered grooves 24 is wider than a width $W_D$ of a dicing blade 27 as shown in FIG. 6.

Next, the silicon wafer 18 is divided into sensor chips by dicing. That is, after the silicon wafer 18 is attached to the self-adhesive sheet 26, the silicon wafer 18 is cut along the dicing lines Lb by utilizing the dicing blade 27. In this case, the dicing blade 27 cuts the silicon wafer 18 so that side faces of the dicing blade 27 pass the sloped side walls 24a of each tapered groove 24 as shown in FIG. 8. As a result, it is prevented that cracks and chippings of the silicon wafer 18 occur at edge portions cut by the dicing blade 27. The silicon wafer 18 can be divided into each sensor chip without having any cracks and chippings by dicing.

Figure 9:
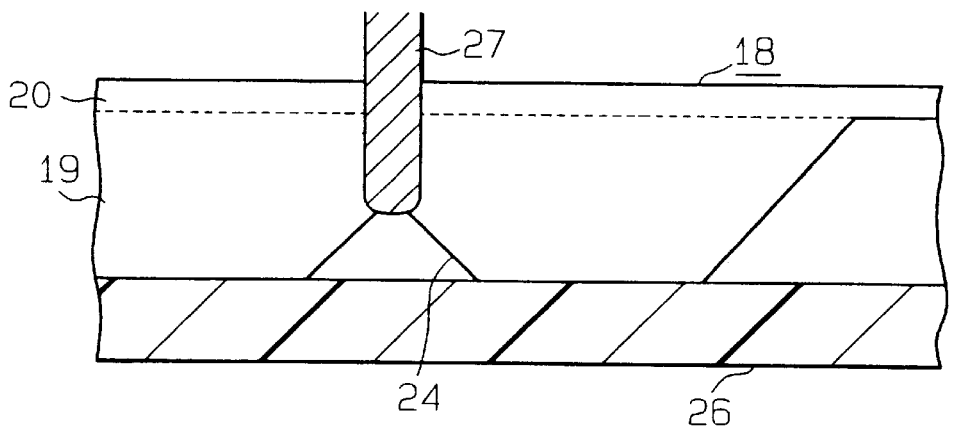
Figure 10:
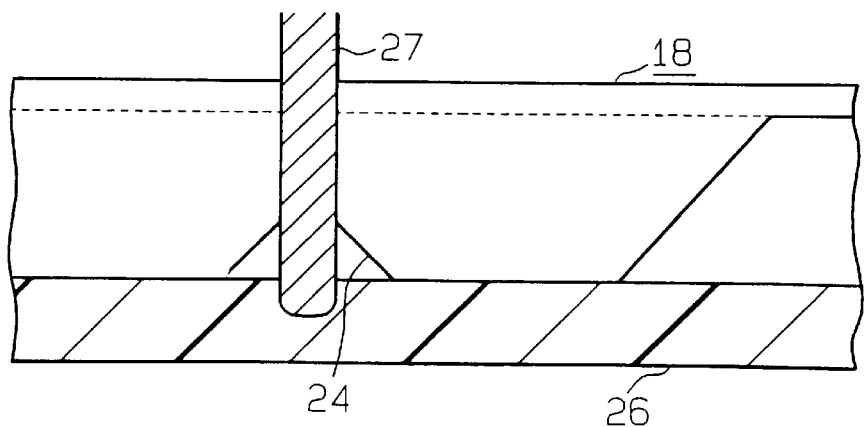

In the case that a depth of cut of the dicing blade 27 is not enough as shown in FIG. 9, the cracks and the chippings of the silicon wafer 18 become liable to occur at the edge portions cut by the dicing blade 27. Further, as shown in FIG. 10, in the case that the depth of cut of the dicing blade 27 is so deep that the dicing blade 27 reaches the self-adhesive sheet 26, the following deficiencies occur. That is, a life of the dicing blade 27 deteriorates due to abrasion with the self-adhesive sheet 26, and cut wastes of the self-adhesive sheet 26 are generated. Therefore, as shown in FIG. 8, it is desirable that the dicing blade 27 cuts the silicon wafer 18 to a depth enough for cutting the side walls 24a of the tapered grooves 24 and not to reach the self-adhesive sheet 26.

Further, the tapered grooves 24 function as discharge grooves for discharging cutting water and the cut wastes generated during the dicing process. Accordingly, the cracks and the chippings of the silicon wafer 18 can be further prevented. consequently, yield of the wafer is improved, resulting in low cost of the sensor chip.

Figure 11:
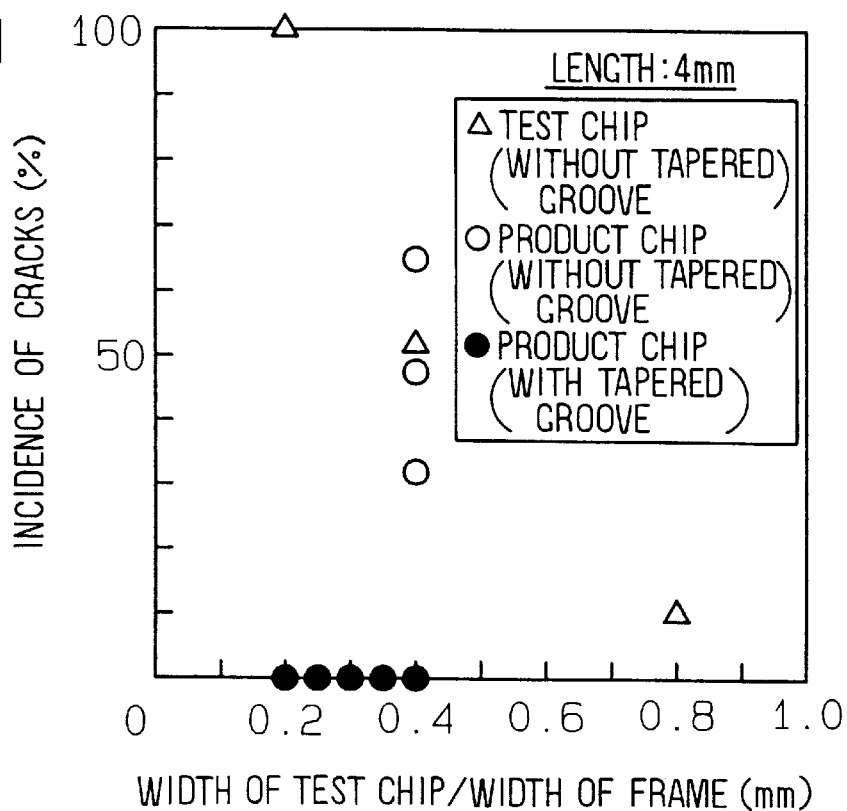
FIG. 11 is a graph showing a result of an experiment regarding incidences of cracks which are generated on the acceleration sensor in a dicing process.
Figure 12:
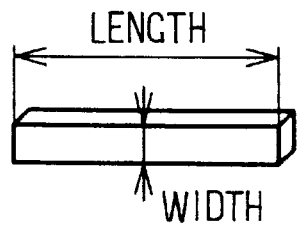
FIG. 12 is a schematic view showing a test chip used in the experiment.
Figure 13:
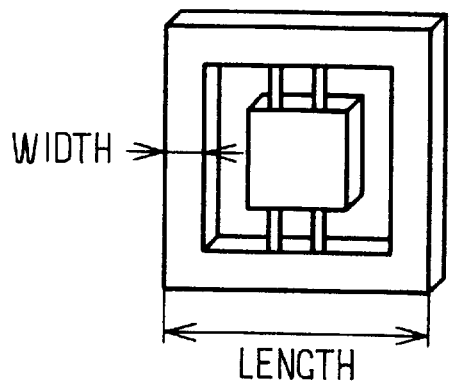
FIG. 13 is a schematic view showing a product chip used in the experiment.

FIG. 11 shows incidences of cracks in the cases that the tapered grooves 24 are formed, and are not formed. As samples for evaluating the incidences of cracks, a test chip (a test piece) having a pole-like shape shown in FIG. 12 and a product chip having a rectangular frame shown in FIG. 13 are employed. In FIG. 11, the vertical axis indicates the incidences of cracks, while the transverse axis indicates the widths of the test chip or the frame of the product chip. Here, each length of the test chip and the frame of the product chip is 4 mm. In FIG. 11, white triangles show values obtained from the test chips without having the tapered grooves, white circles show values obtained from the product chips without having the tapered grooves, and black circles show values obtained from the product chips having the tapered grooves. According to the result of the experiment shown in FIG. 11, in the case that the tapered grooves are not formed on the test chips or the product chip, the incidence of cracks is high. As opposed to this, in the case that the tapered grooves are formed on the product chip, the incidence of cracks is substantially zero; this means that no crack arises. Further, concerning the incidences of cracks obtained form the test chips without having the tapered grooves (indicated by the white triangles), the smaller the width of the test chip becomes, the higher the incidence of cracks becomes.

Figure 14:
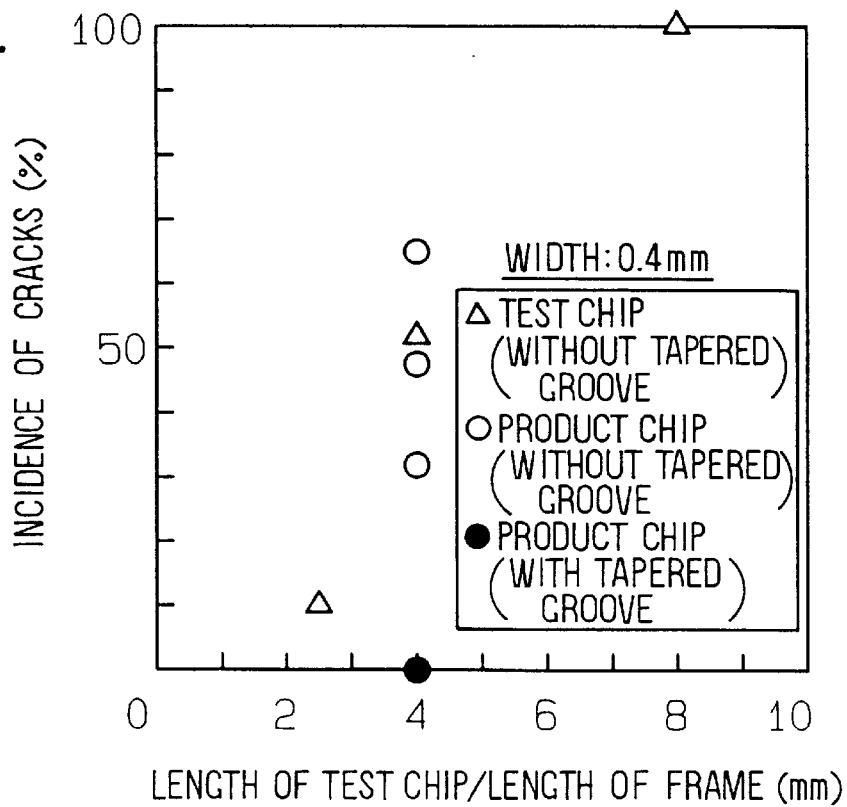
FIG. 14 is a graph showing a result of the experiment regarding the incidences of cracks which are generated on the acceleration sensor in the dicing process.

FIG. 14 also shows the incidences of cracks in the cases that the tapered grooves 24 are formed, and are not formed. In FIG. 14, the vertical axis indicates the incidences of cracks, while the transverse axis indicates the lengths of the test chip or the frame of the product chip. Here, each width of the test chip and the frame of the product chip is 0.4 mm. In FIG. 14, the meanings of white triangles, white circles, and black circles are the same as those in FIG. 11. According to the result shown in FIG. 14, in the case that the tapered grooves are formed on the test chip or on the product chip, the incidence of crack is high, and in the case that the tapered grooves are not formed on the product chip, the incidence of cracks is substantially zero. Further, concerning the incidences of cracks of the test chips without having the tapered grooves (indicated by the white triangles), the longer the length of the test chip becomes, the higher the incidence of cracks becomes.

Consequently, as shown in FIGS. 11 and 14, it is confirmed that the tapered grooves can reliably decrease the incidence of cracks.

The incidence of cracks changes depending on conditions of dicing, types of the self-adhesive sheet, and the like in addition to the chip size.

In this embodiment, the silicon wafer 18 is cut by dicing so that each side face of the dicing blade 27 passes each sloped side wall 24a of each tapered groove 24, so that the side walls 24a remain on the outer circumferential faces (dicing portions) of the silicon substrate 1 as shown in FIGS. 2 and 3.

Finally, as shown in FIGS. 2 and 3, the rectangular silicon substrate 1 is bonded to the ceramic substrate 15 through the adhesives 16.

The above mentioned first embodiment of the present invention has the following features (A) to (C). (A) The tapered grooves 24 having the sloped side walls 24a are formed on the back face of the silicon wafer 18 to correspond to the dicing lines Lb, and the back face of the silicon wafer 18 is attached to the self-adhesive sheet 26. Thereafter, the silicon wafer 18 is cut by dicing to be divided into the sensor chips. In this case, each side face of the dicing blade 27 cut each sloped side wall 24a of each tapered groove 24. Therefore, the cracks and the chippings of the silicon wafer 18 become less susceptible to occur at the edge portions cut by the dicing blade 27.

(B) The tapered grooves 24 having the sloped side walls 24a are formed on the back face of the silicon substrate 18 along with the thin portions 25 by the anisotropic etching process. As compared to another method in which the tapered grooves 24 and the thin portions 25 are formed by each etching processes, the etching process of making the tapered grooves 24 and the thin portions 25 is simple.

(C) As shown in FIGS. 11 and 14, even if the width of the frame 15 is smaller than 1 mm to make the sensor chip size small, in the case that the tapered grooves 24 are formed on the back face of the silicon wafer, it is difficult to generate the cracks and the chippings of the silicon wafer 18 at the edge portions cut by the dicing blade. Accordingly, even if the width of the frame 15 is smaller than 1 mm, the frame 5 can be prevented from being broken under its handling when the sensor chip is mounted, and the inferior junction of the frame 5 can be prevented.

Next, a second embodiment according to the present invention will be described referring to FIGS. 15 to 18.

Figure 15:
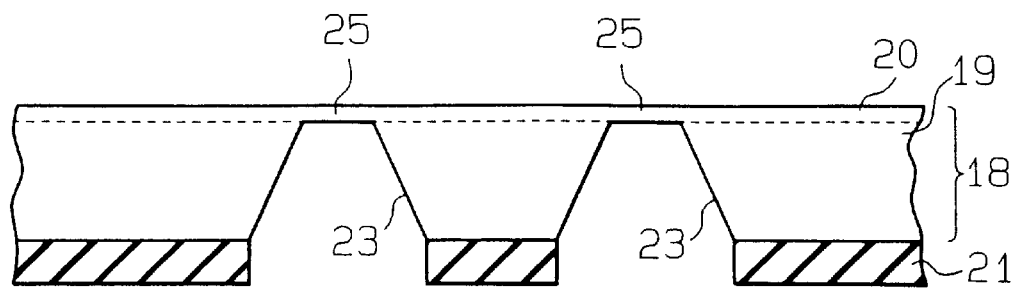
FIGS. 15 to 20 are cross-sectional views of a semiconductor acceleration sensor in a second embodiment for explaining processes of manufacturing the same.

In the second embodiment, firstly, only recesses 23 for forming the thin portions 25 are formed by the anisotropic etching process as shown in FIG. 15.

Figure 16:
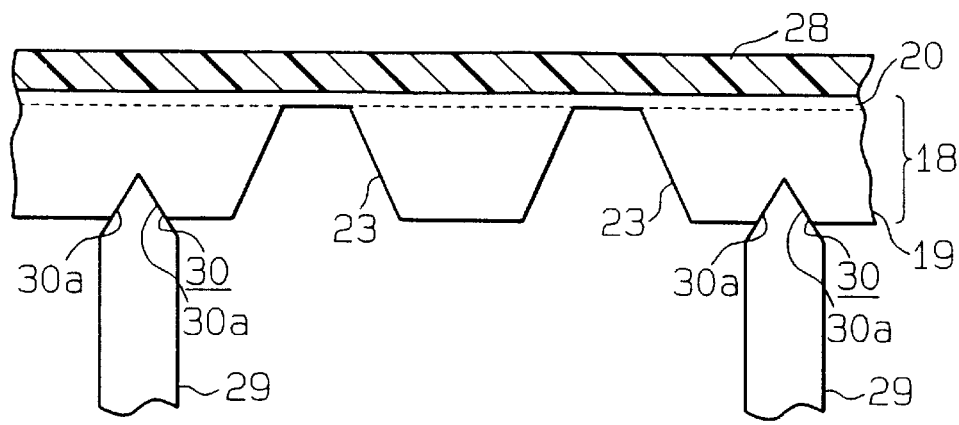

Next, after the SiN layer 21 is removed, the surface of the n-type epitaxial layer 20 is attached to a fixing member (a self-adhesive sheet) 28 as shown in FIG. 16, thereby fixing the silicon wafer 18. In this state, tapered grooves 30 are formed on the back face of the silicon wafer 18 along the dicing lines Lb by utilizing a blade 29. The blade 29 has an wedge-shaped end. Accordingly, the tapered grooves 30 having sloped side walls 30a are obtained. As the blade 29, for example, a V-shaped type blade used for chamfering can be adopted.

Figure 17:
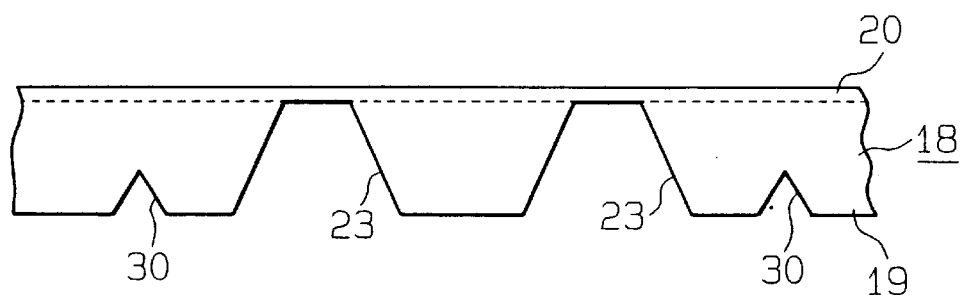

Thereafter, as shown in FIG. 17, the silicon wafer 18 is detached from the fixing member 28, and then, it is etched from the surface of the n-type epitaxial layer 20 to form the through grooves 4. As a result, the beams 7 to 10 shown in FIGS. 1 to 3 are formed on the silicon wafer 18.

Figure 18:
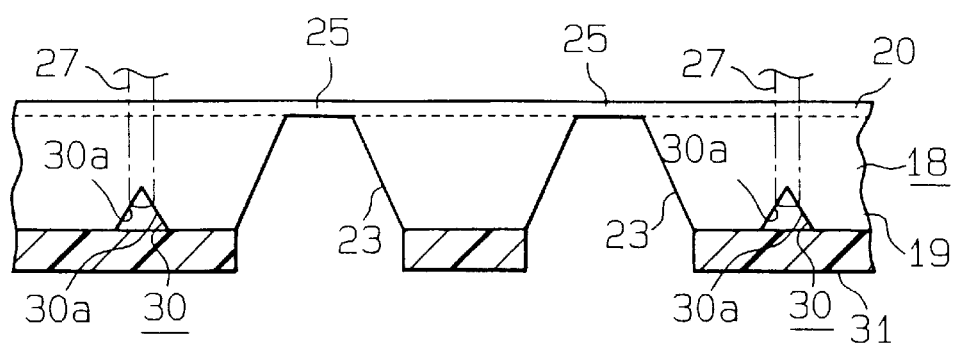

Thus obtained silicon wafer 18 is attached to a self-adhesive sheet 31 for dicing so that the tapered grooves 30 face the self-adhesive sheet 31, and the dicing process utilizing the dicing blade 27 is performed on the silicon wafer 18 as shown in FIG. 18.

In this case, the side faces of the dicing blade 27 cut the sloped side walls 30a of each tapered groove 30, thereby preventing the cracks and the chippings of the silicon wafer 18 at the edge portions cut by the dicing blade 27. The other features and effects are the same as those in the first embodiment.

As a modified embodiment of the second embodiment, the processes of manufacturing the sensor chips may be performed in the following way.

Figure 19:
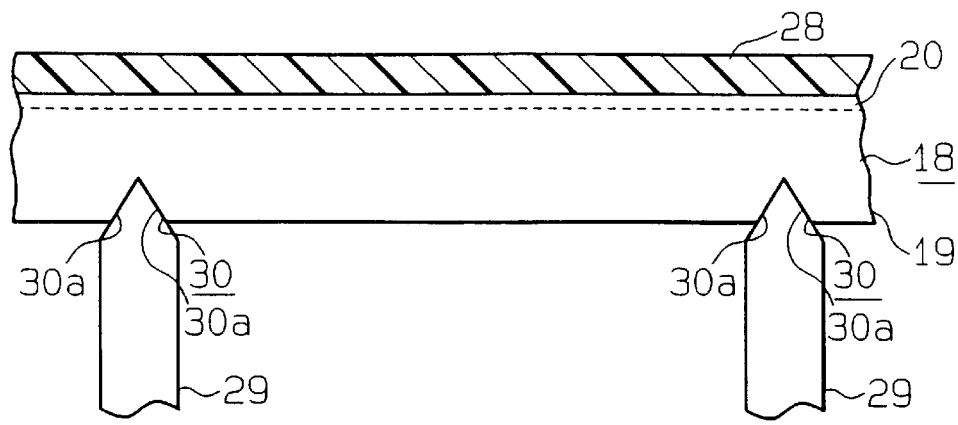

As shown in FIG. 19, before the recesses 23 and the tapered grooves 30 are formed on the silicon wafer 18, the silicon wafer 18 is attached to the fixing member 28, and then, the tapered grooves 30 having the sloped side walls 30a are formed on the back face of the silicon wafer 18 by the blade 29 having the wedge-shaped end.

Figure 20:
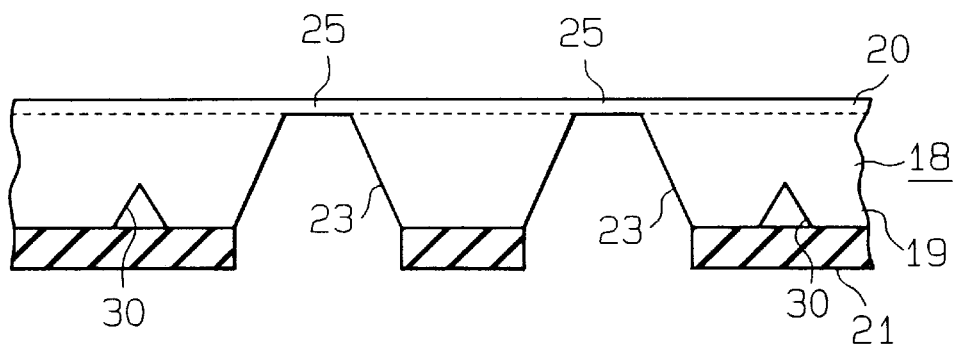

Thereafter, the silicon wafer 18 is detached from the fixing member 28, and the SiN layer 21 is deposited on the back face of the silicon wafer 18. The SiN layer 21 is patterned into a predetermined shape to function as an etching mask. The p-type silicon wafer 19 is etched by the anisotropic etching process utilizing the KOH aqueous solution, whereby the recesses 23 having the thin portions 25 at the bottom thereof are formed as shown in FIG. 20. The thin portions 25 are composed of the n-type epitaxial layer 20.

Thereafter, the SiN layer 21 is removed from the silicon wafer 18. The other features and the effects are the same as those in the second embodiment.

In the first and second embodiments, each of the tapered grooves 24 and 30 has the sloped side walls 24a and 30a forming a triangular cross-sectional shape and elongating along the dicing lines Ld as shown in FIGS. 8 and 18. However, the cross-sectional shape of the grooves 24 and 30 is not limited to a certain shape, and a grooves 32 having an half-round cross-sectional shape shown in FIG. 21 may be adopted. This groove 32 can be formed by an isotropic etching process or the like.

Figure 22:
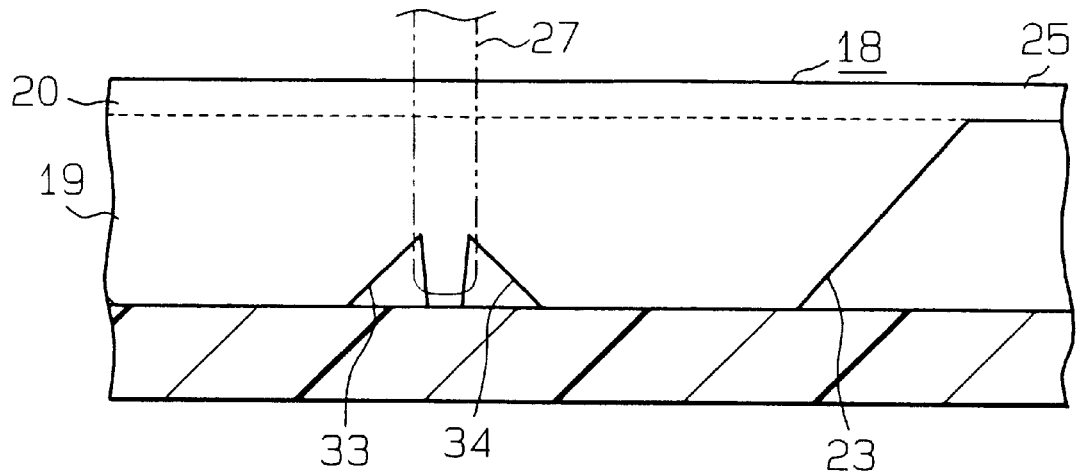
FIG. 22 is a cross-sectional view showing grooves formed on a semiconductor acceleration sensor in a modified embodiment.

Further, in the first and second embodiments, although one tapered groove is formed along one dicing line Lb, two grooves 33 and 34 may be formed along one dicing line Lb as shown in FIG. 22. In this case, one side face of the dicing blade 27 cuts a side wall of the groove 33, while the other side face of the dicing blade 27 cuts a side wall of the groove 34 at the same time.

In the above mentioned embodiments, although the present invention is applied to the semiconductor acceleration sensor having the thin portion and the strain gauges formed on the thin portion, it is apparent that the present invention can be applied to a semiconductor pressure sensor and the like.

Next, a third embodiment will be described referring to drawings.

In the third embodiment, the present invention is applied to a semiconductor pressure sensor.

Figure 23:
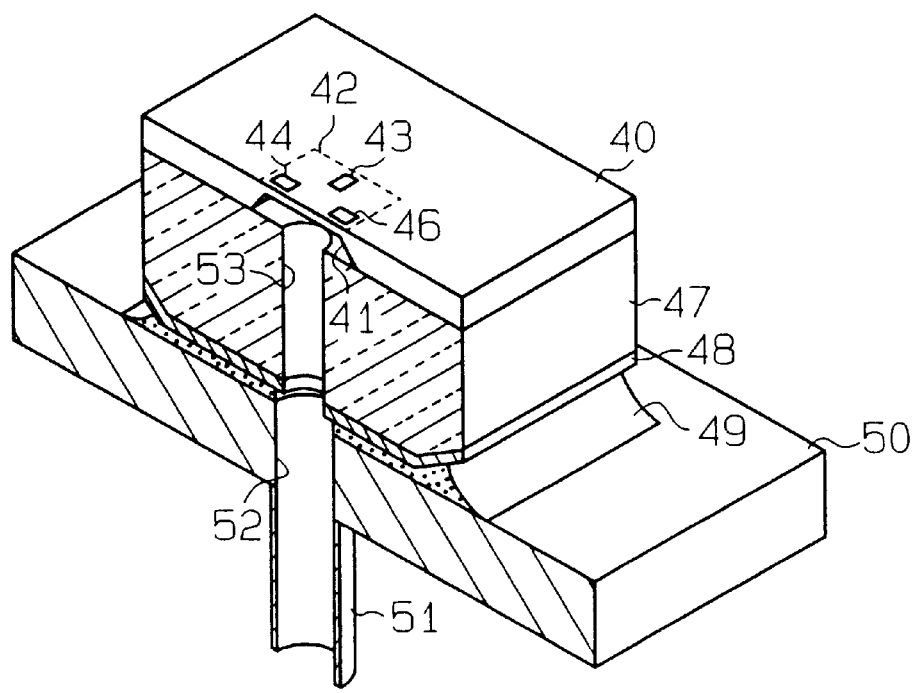
FIG. 23 is a perspective view showing a semiconductor pressure sensor in a third embodiment according to the present invention.
Figure 24:
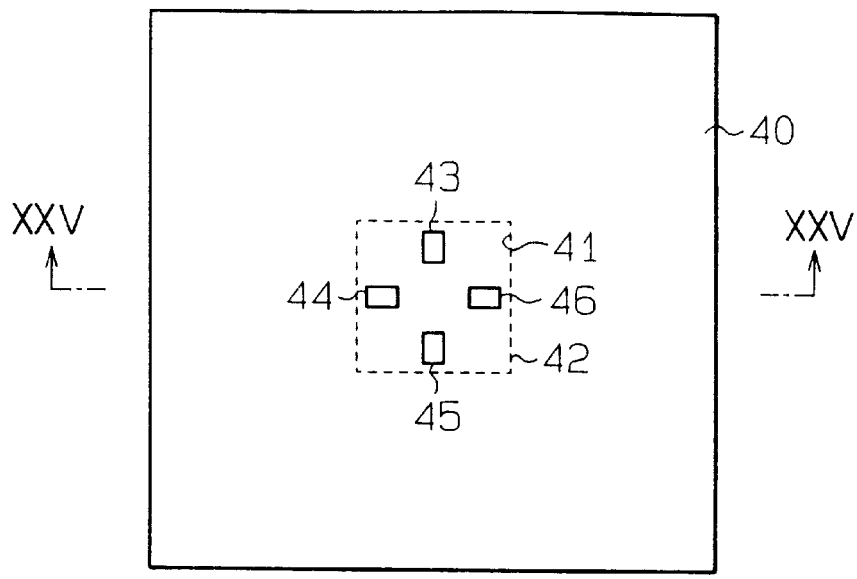
FIG. 24 is a plan view showing the pressure sensor in the third embodiment.
Figure 25:
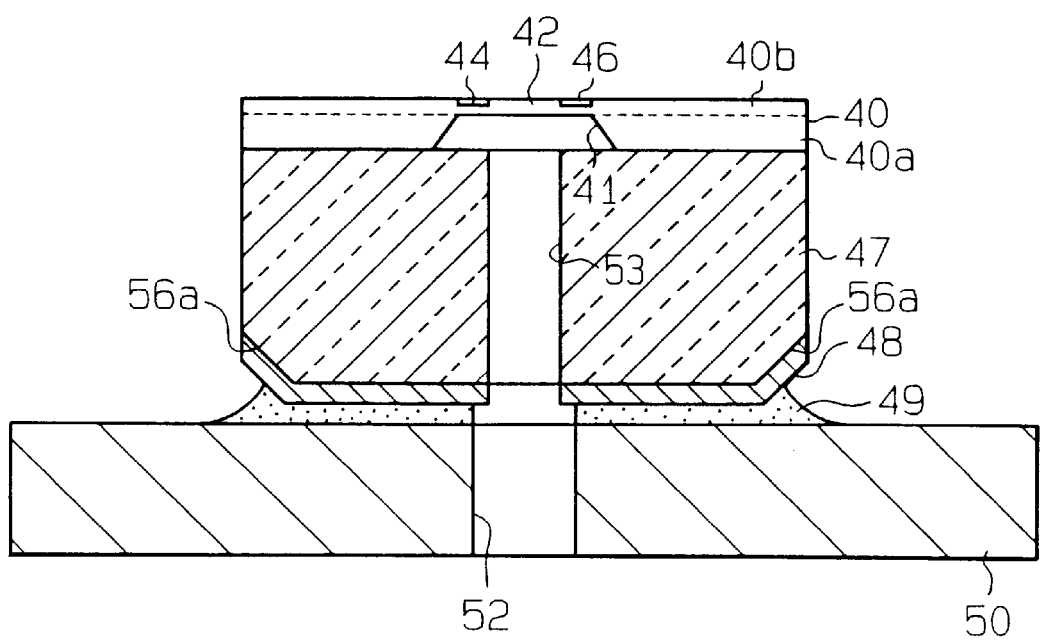
FIG. 25 is a cross-sectional view taken along the XXV—XXV line in FIG. 24 showing the pressure sensor.

As shown in FIGS. 23 to 25, the semiconductor pressure sensor has a square silicon single-crystal substrate (silicon chip) 40 composed of a p-type silicon substrate 40a and an n-type epitaxial layer 40b formed on the p-type silicon substrate 40a. The silicon substrate 40 is used as a semiconductor substrate and has a recess 41 and a diaphragm 42 formed at the bottom of the recess 41.

Further, strain gauges 43 to 46 are formed on the surface layer of the diaphragm 42. Each of the strain gauges 43 to 46 is a p-type impurity diffusion layer (a piezoresistance layer) of which a value of resistance changes in response to an amount of strain applied to the diaphragm 42.

The silicon substrate 40 is joined to an upper face of a glass base 47. On the lower face of the glass base 47 is formed a vapor deposition layer 48 made of metals such as titanium (Ti)/nickel (Ni)/aluminum (Al) laminated layer or the like. The glass base 47 is further bonded to a metallic stem 50 through a solder layer 49 and the vapor deposition layer 48. In this case, the vapor deposition layer 28 improves wettability of solder, whereby a strength of junction between the glass base 47 and the metallic stem 50 is improved. Further, as shown in FIG. 23, a pipe 51 for introducing pressure to the lower face of the diaphragm 42 is fixed at the lower face of the metallic stem 50 so as to communicate with the recess 41 via through holes 52 and 53. The through holes 52 and 53 are formed in the metallic stem 50 and in the glass base 47, respectively. In the diaphragm 42, stress responding to pressures applied to the upper face and to the lower face of the diaphragm 42 occurs, thereby generating strain. In response to an amount of the strain, the values of resistance of the strain gauges 43 to 46 change to detect the amount of pressure. In more concrete, as shown in FIG. 4, the strain gauges 43 to 46 are connected to form a full-bridge circuit, and the potential difference between the connecting points C and D is output as an electric signal corresponding to the amount of pressure.

Next, processes of manufacturing the semiconductor pressure sensor having the above mentioned configuration will be described by referring to FIGS. 26 to 30.

Figure 26:
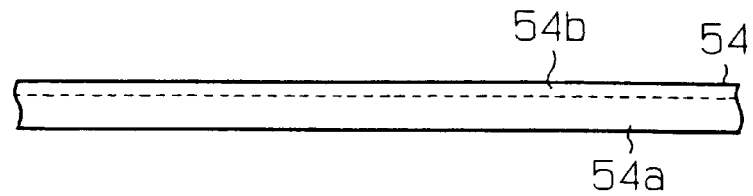
FIGS. 26 to 28 are cross-sectional views of the pressure sensor for explaining processes of manufacturing the same in the third embodiment.

Firstly, as shown in FIG. 26, a (100) silicon wafer 54 having a p-type silicon wafer 54a and an n-type epitaxial layer 54b formed on the p-type silicon wafer 54a is prepared.

A p+ diffusion layer is formed at predetermined areas of the surface layer of the n-type epitaxial layer 54b as piezoresistance areas to form the strain gauges 43 to 46 shown in FIG. 26, and aluminum wiring is performed on the p+ diffusion layer.

Figure 27:
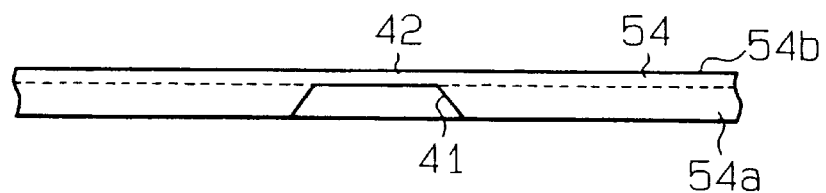

On the back face of the silicon wafer 54, an etching mask which is patterned is disposed. The p-type silicon wafer 54a is etched through the etching mask by the anisotropic etching process utilizing the KOH aqueous solution, thereby forming recesses 41 as shown in FIG. 27. In this case, the etching process is stopped at an interface between the p-type silicon wafer 54a and the n-type epitaxial layer 54b, so that the diaphragms 42 composed of the n-type epitaxial layer 54b are formed at the bottoms of the recesses 41, respectively.

On the other hand, a glass plate 55 having the through holes 53 is prepared for forming the glass base 47.

On the lower face (back face) of the glass plate 55, tapered grooves 56 are formed along dicing lines Lb by dicing utilizing a V-shaped type blade 29 as shown in FIG. 16. The V-shaped type blade 29 is usually used for chamfering. Each of the tapered grooves 56 has sloped side walls 56a elongating along each dicing line Lb.

Here, a silicon base can be adopted as the base instead of the glass base. In the case that the silicon base is adopted, to form the tapered grooves on a silicon wafer for forming the silicon base, the anisotropic etching process utilizing an alkaline aqueous solution such as the KOH aqueous solution is performed on the silicon wafer.

Next, a vapor deposition layer 57 made of metals such as Ti/Ni/Al laminated layer is evaporated on the lower face (back face) of the glass plate 55. Thereafter, the silicon wafer 54 is joined to the upper face of the glass plate 55 by an anode-joining technique. Further, the lower face of the glass plate 55 is attached to a self-adhesive sheet 58 for dicing through the vapor deposition layer 57 before performing the dicing process as shown in FIG. 30.

Although the tapered grooves 56 and the vapor deposition layer 57 are formed before the silicon wafer 54 is joined to the glass plate 55, they may be formed after the silicon wafer 54 is joined to the glass plate 55.

Figure 30:
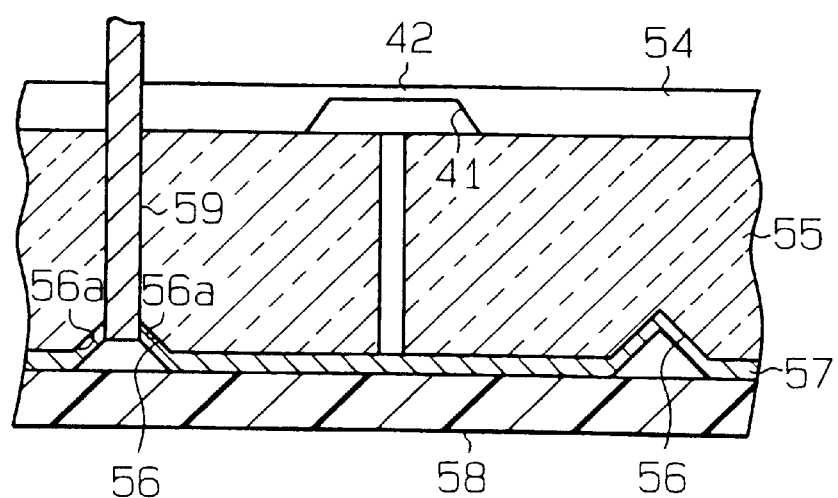
FIG. 30 is a cross-sectional view of the pressure sensor for explaining a process of manufacturing the same in the third embodiment.
Figure 31:
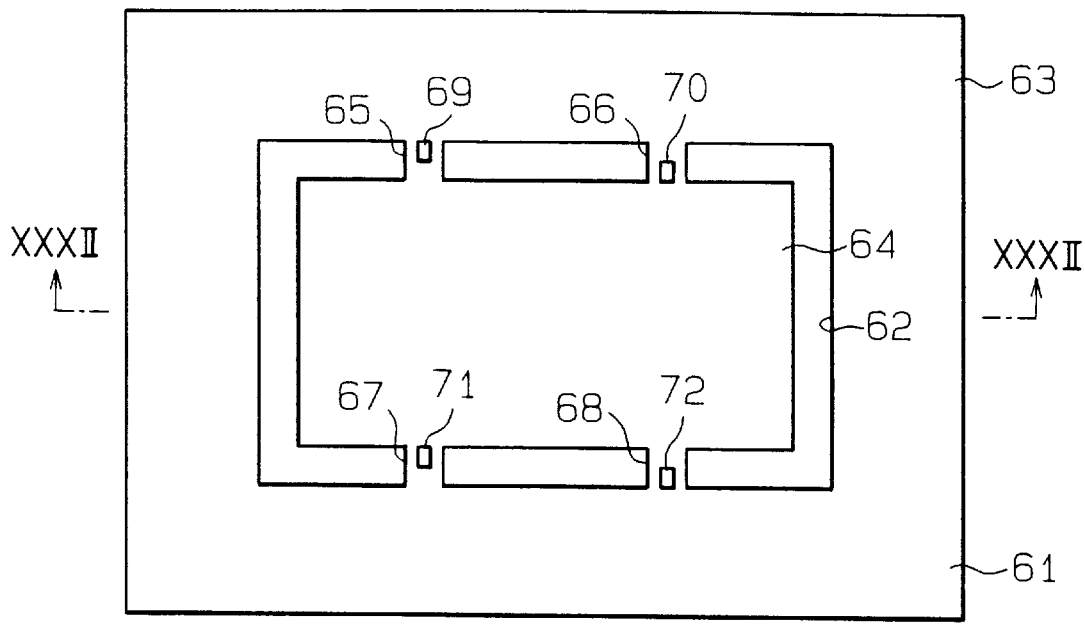
FIG. 31 is a plan view showing a semiconductor acceleration sensor according to a prior art.
Figure 32:
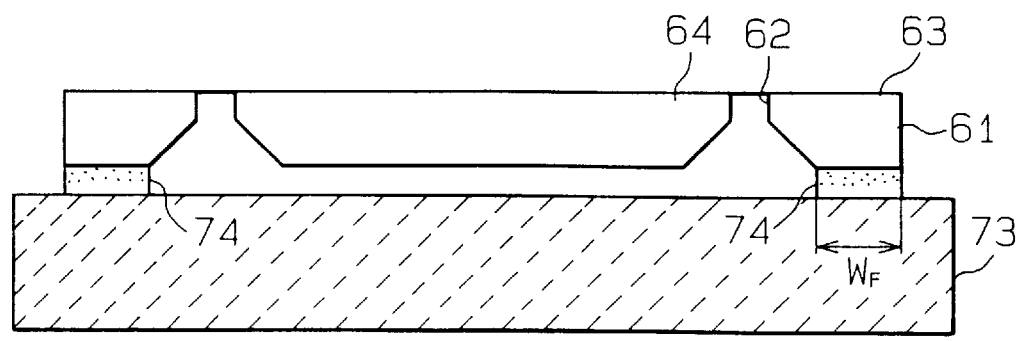
FIG. 32 is a cross-sectional view taken along the XXXII—XXXII line in FIG. 31 showing the acceleration sensor.
Figure 33:
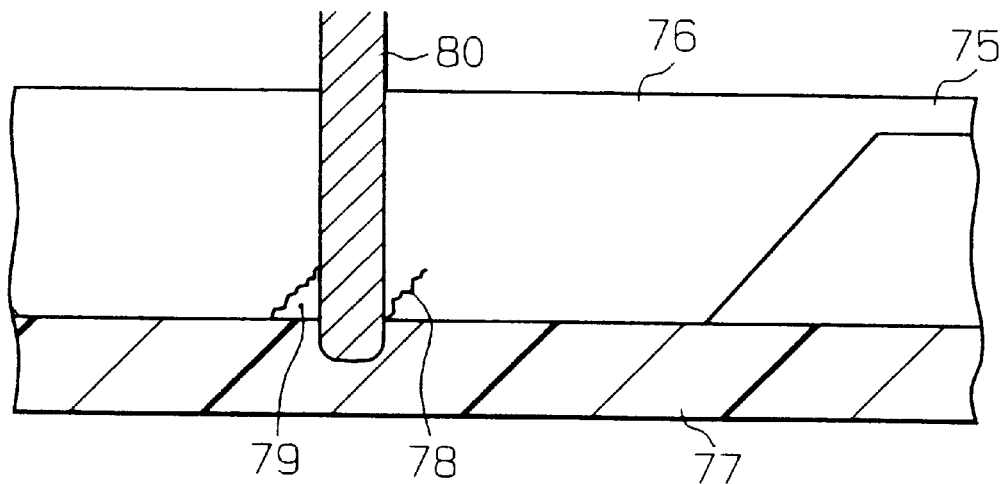
FIG. 33 is a cross-sectional view of the acceleration sensor for explaining a process of manufacturing the same in the prior art.
Figure 34:
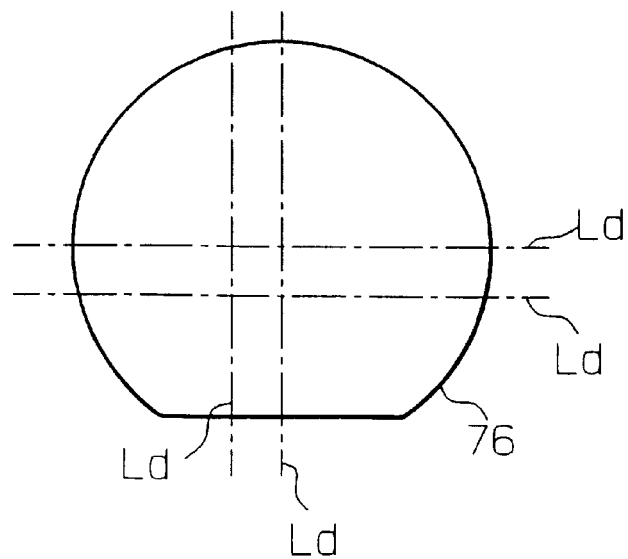
FIG. 34 is a plan view showing a silicon wafer and dicing lines used in a process of manufacturing the acceleration sensor in the prior art.
Figure 35:
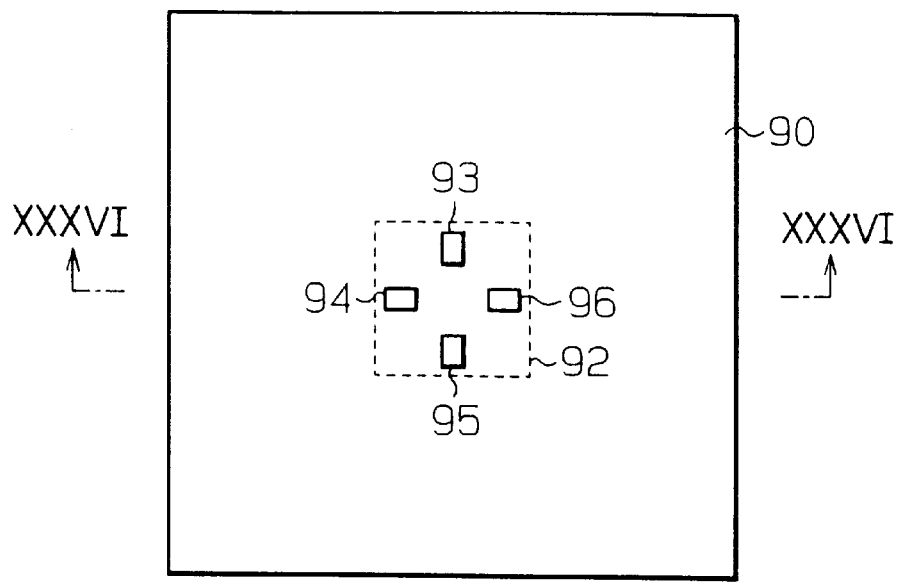
FIG. 35 is a plan view showing a semiconductor pressure sensor in a prior art.

Here, it should be noted that each width of the tapered grooves 56 is wider than a width of a dicing blade 59 as shown in FIG. 30. Accordingly, a part of each side wall 56a remains on an outer circumferential face of a sensor chip after dicing.

Next, the dicing process is performed on the silicon wafer 54 and the glass plate 55 as shown FIG. 30.

In more detail, after the glass plate 55 is attached to the self-adhesive sheet 58, the silicon wafer 54 joined to the glass plate 55 is cut along the dicing lines Lb by dicing so that the side faces of the dicing blade 59 pass the sloped side walls 56a of each tapered groove 56, respectively. Accordingly, the silicon wafer 54 joined to the glass plate 55 is divided into sensor chips, whereby the sensor chip having the glass base 47 and the silicon substrate 40 joined to the glass base 47 can be obtained as shown in FIG. 25.

In the process of dicing, because the dicing blade 59 cuts the sloped side walls 56a of each tapered groove 56, cracks and chippings of the glass plate 55 become less susceptible to occur at the edge portions cut by the dicing blade 59. In addition, because the cracks and chippings of the glass plate 55 can be prevented, the exfoliation of the vapor deposition layer 57 from the glass plate 55 can be also prevented.

After cutting the silicon wafer 54 and the glass plate 55 by dicing, as shown in FIG. 25, the sloped side walls 56a of the tapered grooves 56 remain on the outer circumferential faces of the glass base 47 of the sensor chip.

Thus obtained sensor chip is bonded to the metallic stem 50 by soldering. In this case, the vapor deposition layer 57 (48) is left on the back face of the glass base 47 without being separated from the glass plate 55 by dicing, thereby enhancing the strength of junction between the glass base 47 and the metallic stem 50.

Further, the sloped side walls 56a having the vapor deposition layer 57 are left on the outer circumferential faces of the glass base 47 and function as bonding faces to be bonded to the metallic stem 50 by soldering. That is, in this embodiment, not only the lower face but also side faces of the glass base 47 function as the bonding faces to be bonded to the metallic stem 50. As a result, especially at the periphery of the glass base 47, the strength of junction between the glass base 47 and the metallic stem 50 is further enhanced compared to a conventional structure shown in FIG. 36.

In this way, the semiconductor pressure sensor shown in FIGS. 23 to 25 is produced.

The third embodiment according to the present invention has the following features (A) and (C).

(A) In the processes of producing the semiconductor pressure sensor, firstly, the tapered grooves 56 having the sloped side walls 56a are formed along the dicing lines Lb on the back face of the glass plate 55.

Thereafter, the back face of the glass plate 55 is attached to the self-adhesive sheet 58. The silicon substrate 54 is joined to the other face of the glass plate 55 in advance.

In this state, the silicon wafer 54 and the glass plate 55 are cut to be divided into sensor chips by dicing so that the side faces of the dicing blade 59 pass the side walls 56a of each tapered groove 56, respectively. Therefore, it can be prevented that the cracks and chippings of the glass plate 55 occur at the edge portions cut by the dicing blade 59.

(B) On the back face of the glass plate 55 is formed the vapor deposition layer 57, and the glass plate 55 is attached to the self-adhesive sheet 58 through the vapor deposition layer 57. Thereafter, the dicing process is performed on this glass plate 55. In this embodiment, because the cracks and chippings of the glass plate 55 can be prevented due to the tapered grooves 56 formed on the back face of the glass plate 55, the exfoliation of the vapor deposition layer 57 can be prevented as well.

(C) After the dicing process, the glass base 47 is joined to the metallic stem 50 through the solder layer 49 and the vapor deposition layer 57 (48). In this case, because the vapor deposition layer 57 is left on the glass base 47 without being separated form the glass base 47, the strength of junction between the glass base 47 and the metallic stem 50 can be enhanced. In addition, because the sloped side walls 56a are left on the outer circumferential faces of the glass base 47 and function as the bonding faces, the strength of junction between the glass base 47 and the metallic stem 50 can be further enhanced.

Figure 28:
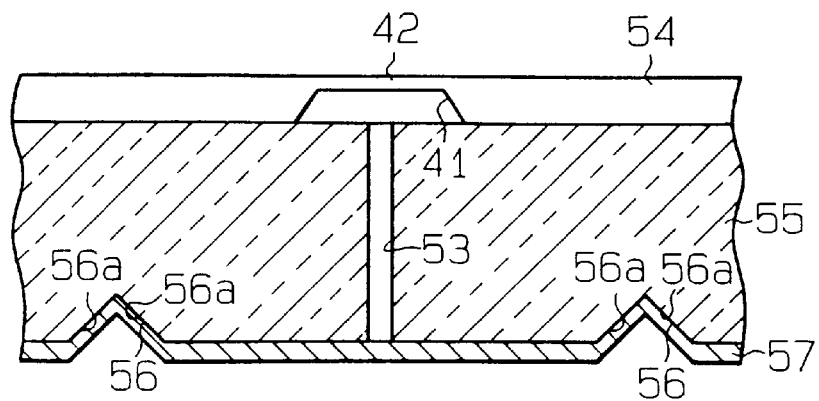
Figure 29:
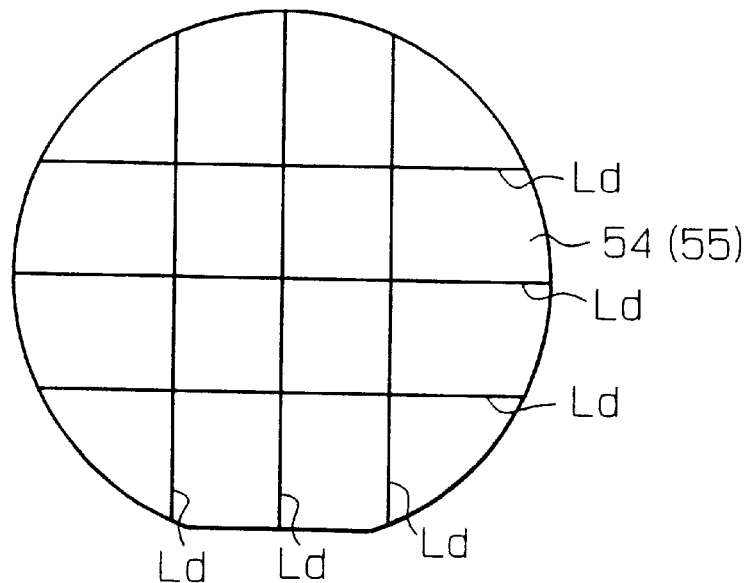
FIG. 29 is a plan view showing a silicon wafer and dicing lines used for producing the pressure sensor in the third embodiment.

In the third embodiment, after the tapered grooves 56 are formed on the glass plate 55, the vapor deposition layer 57 is formed on the glass plate 55 as shown in FIG. 28. However, the vapor deposition layer 57 may be formed on the glass plate 55 before forming the tapered grooves 56.

Figure 21:
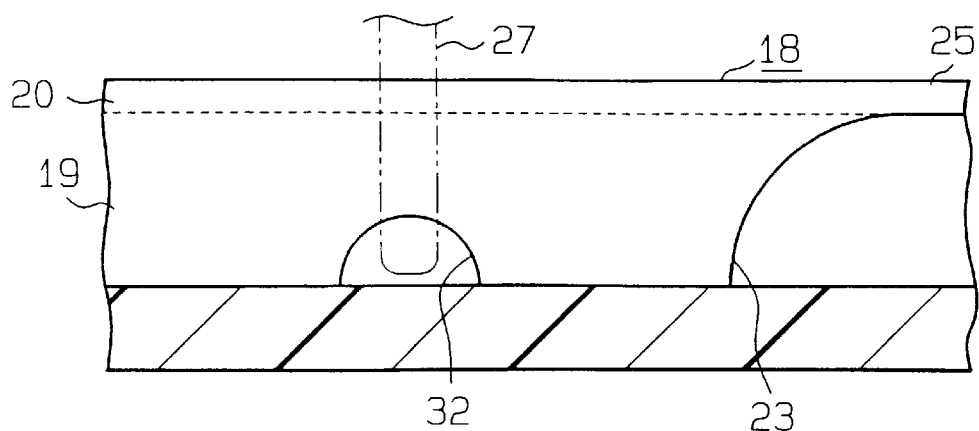
FIG. 21 is a cross-sectional view showing a groove formed on a semiconductor acceleration sensor in a modified embodiment.

Although the tapered grooves 56 shown in FIG. 28 have the sloped side walls 56a being planes, the groove 32 shown in FIG. 21 can be adopted in addition to the tapered grooves 56. The groove 32 has a half-round cross-sectional shape. Further, the right and left side faces of the dicing blade 59 cut the right and left side walls 56a of one groove 56, respectively, as shown in FIG. 28. However, as shown in FIG. 22, the right and left side faces of the dicing blade 27 can cut side walls of the grooves 33 and 34, respectively.

Figure 36:
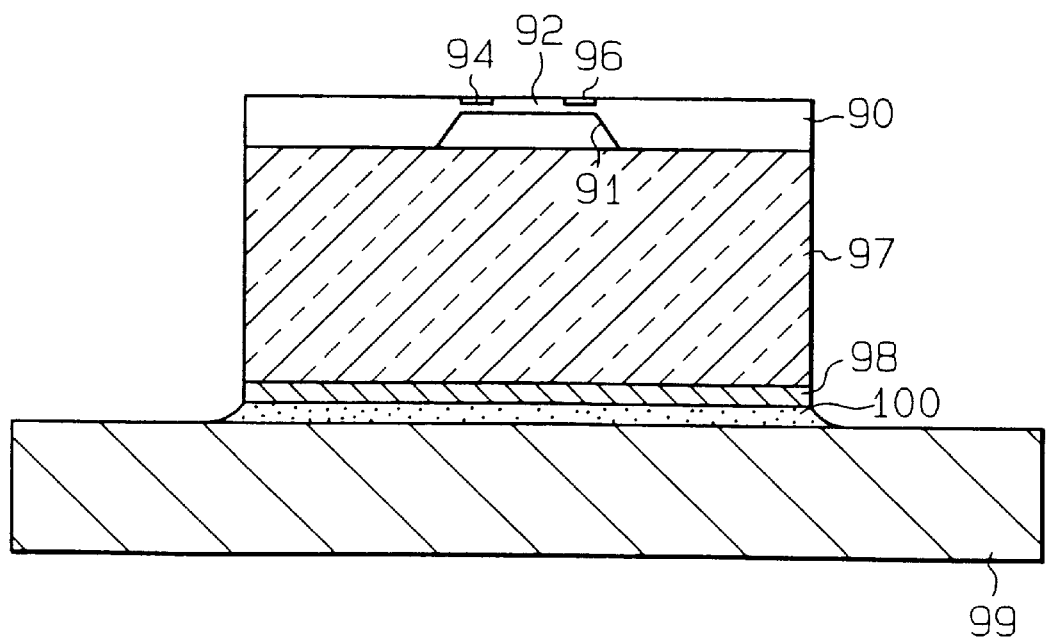
FIG. 36 is a cross-sectional view taken along the XXXVI—XXXVI line in FIG. 35 showing the pressure sensor in the prior art.
Figure 37:
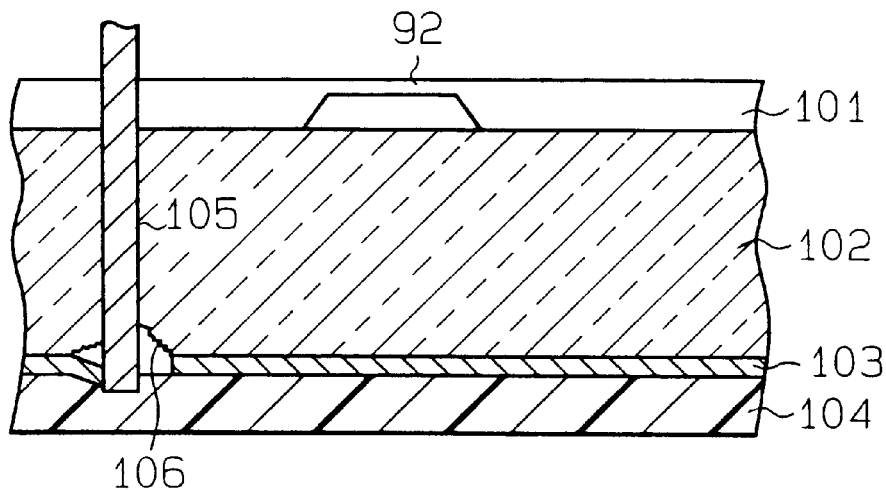
FIG. 37 is a cross-sectional view of the pressure sensor for explaining a process of manufacturing the same in the prior art.
Figure 38:
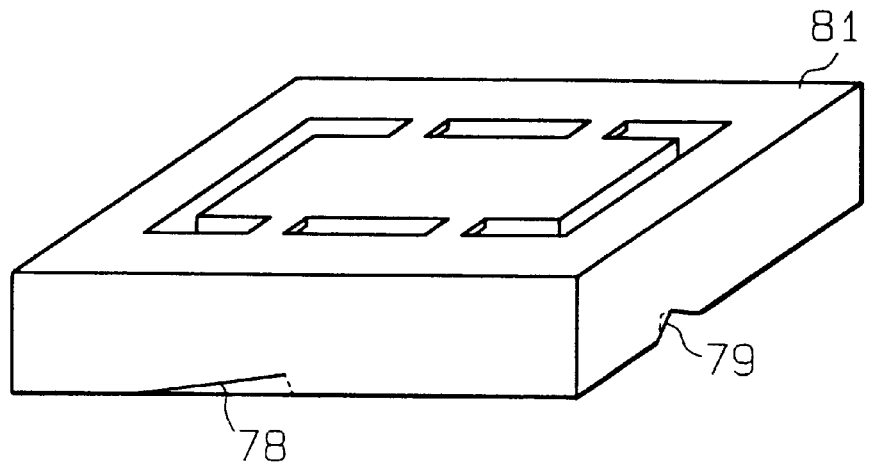
FIG. 38 is a perspective view showing the pressure sensor in the prior art.

As shown in FIG. 23, in the third embodiment, the present invention is applied to the semiconductor pressure sensor having the pressure introduction hole (52 and 53) through which pressure is applied to the back face of the diaphragm. In addition, the present invention can be applied to a semiconductor pressure sensor without having a pressure introduction hole as shown in FIG. 36. In this semiconductor pressure sensor, pressure is only applied to a front face of a diaphragm.

Further, in the third embodiment, although the semiconductor pressure sensor having the semiconductor substrate joined to the base is employed, it is apparent that a semiconductor acceleration sensor can be employed.

In addition to the semiconductor pressure sensor and the semiconductor acceleration sensor, a semiconductor dynamic sensor such as a yaw rate sensor or the like can be adopted. The present invention is further applicable to a method of producing the other chips than the sensor chip.

While the present invention has been shown and described with reference to the foregoing preferred embodiment, it will be apparent to those skilled in the art that changes in form and detail may be made therein without departing from the scope of the invention as defined in the appended claims.

What is claimed is:

1. A method of producing a semiconductor device from a semiconductor wafer by dicing, the method comprising:

forming grooves having sloped side walls on a back face of the semiconductor wafer along dicing lines to be cut by dicing;

attaching the back face of the semiconductor wafer to a self-adhesive sheet; and cutting the semiconductor wafer along the grooves from a face opposite to the back face of the semiconductor wafer by dicing utilizing a dicing blade so that side faces of the dicing blade pass through the sloped side walls of the grooves, thereby forming the semiconductor device, wherein each of the side faces of the dicing blade forms an obtuse angle with a corresponding one of the sloped side walls on a semiconductor wafer side when the semiconductor wafer is cut.

2. A method of producing a semiconductor device according to claim 1, wherein;

the semiconductor device is a semiconductor sensor composed of a substrate, a thin portion formed on the substrate and strain gauges formed on the thin portion.

3. A method of producing a semiconductor device according to claim 2, wherein;

the grooves and the thin portion are formed on the semiconductor wafer by anisotropic etching at the same time.

4. A method of producing a semiconductor device according to claim 3, wherein:

the semiconductor wafer is a (100) silicon single-crystal substrate; and each of the grooves formed on the semiconductor wafer has {111} planes on the sloped side walls thereof.

5. A method of producing a semiconductor device according to claim 2, wherein;

the semiconductor sensor further has a thick frame formed on the substrate, and the thick frame is bonded to a base through adhesives after the semiconductor wafer is divided into each semiconductor device.

6. A method of producing a semiconductor device according to claim 5, wherein;

a width of the thick frame is smaller than 1 mm.

7. A method of producing a semiconductor device according to claim 2, wherein;

the semiconductor sensor is a semiconductor acceleration sensor.

8. A method of producing a semiconductor device according to claim 1, wherein each of the sloped side walls has a specific inclination.

9. A method of producing a semiconductor device according to claim 1, wherein;
   each of the grooves has a triangular cross-sectional shape.

10. A method of producing a semiconductor device from a semiconductor wafer by dicing, the method comprising:
   forming grooves each having a half round cross-sectional shape on a first face of the semiconductor wafer by isotropically etching the semiconductor wafer;
   attaching the first face of the semiconductor wafer to a self-adhesive sheet; and
   cutting the semiconductor wafer along the grooves from a second face opposite to the first face of the semiconductor wafer by dicing utilizing a dicing blade with side faces to divide the semiconductor wafer into each semiconductor device, the side faces of the dicing blade each forming an obtuse angle with a corresponding one of the sloped side walls on a semiconductor wafer side.

11. A method of producing a semiconductor device from a semiconductor wafer and a base member by dicing, the method comprising:
   forming grooves having sloped side walls on a first face of the base member;
   joining the semiconductor wafer to a second face of the base member;
   attaching the first face of the base member to a self-adhesive sheet; and
   cutting the semiconductor wafer and the base member joined to each other along the grooves from a side of the semiconductor wafer by a dicing blade so that side faces of the dicing blade pass through the sloped side walls of the grooves, thereby dividing the semiconductor wafer and the base member into each semiconductor device,
   wherein each of the side faces of the dicing blade forms an obtuse angle with a corresponding one of the sloped side walls on a semiconductor wafer side when the semiconductor wafer is cut.

12. A method of producing a semiconductor device according to claim 11, wherein:
   a metallic layer is formed on the first face of the base member; and
   the base member is attached to the self-adhesive sheet through the metallic layer.

13. A method of producing a semiconductor device according to claim 12, wherein the metallic layer is formed on the first face of the base member before joining the semiconductor wafer to the base member.

14. A method of producing a semiconductor device according to claim 12, wherein the semiconductor sensor is an acceleration sensor.

15. A method of producing a semiconductor device according to claim 11, further comprising forming a through hole in the base member before joining the semiconductor wafer to the base member,
   wherein the semiconductor device is a pressure sensor for detecting a pressure which is introduced through the through hold.

16. A method of producing a semiconductor acceleration sensor having a (100) silicon single-crystal substrate composed of through grooves, a rectangular weight formed at an inner side of the through grooves, a rectangular frame formed at an outer side of the through grooves, and thin beams connecting the rectangular weight and the rectangular frame, the semiconductor acceleration sensor produced from a (100) silicon single-crystal wafer by dicing, the method comprising steps of:
   forming tapered grooves and recesses on a first face of the (100) silicon single-crystal wafer by anisotropic etching;
   forming the through grooves at a bottom of each recess by etching from a second face of the (100) silicon single-crystal wafer, thereby forming the thin beams at the bottom of each recess;
   attaching the first face of the (100) silicon single-crystal wafer to a self-adhesive sheet; and
   cutting the (100) silicon single-crystal wafer along the tapered grooves from the second face by a dicing blade to divide the (100) silicon single-crystal wafer into each semiconductor acceleration sensor.

17. A method of producing a semiconductor acceleration sensor according to claim 16, wherein;
   the tapered grooves has side walls and {111} planes of silicon are exposed on the side walls.

18. A method of producing a semiconductor device from a semiconductor wafer by dicing, the method comprising:
   anisotropically etching a back face of the semiconductor wafer to form a plurality of grooves, the plurality of grooves each having sloped side walls;
   attaching the back face of the semiconductor wafer to a self-adhesive sheet; and
   cutting the semiconductor wafer into the semiconductor device along the plurality of grooves from a face opposite to the back face of the semiconductor wafer by dicing utilizing a dicing blade, the dicing blade having side faces passing through the sloped side walls of the plurality of grooves, wherein
   each of the side faces of the dicing blade defines an obtuse angle with a corresponding one of the sloped side walls on a semiconductor wafer side.

19. A method of producing a semiconductor device according to claim 18, wherein:
   the semiconductor device is a semiconductor sensor including a substrate, a thin portion formed on the substrate, and strain gauges formed on the thin portion; and
   the thin portion is formed by anisotropically etching the back face of the semiconductor wafer together with the plurality of grooves.

20. A method of producing a semiconductor device according to claim 18, wherein:
   the semiconductor sensor includes a thick frame formed on the substrate; and
   the thick frame is bonded to a base through adhesives after the semiconductor wafer is divided into the semiconductor device.

21. A method of producing a semiconductor device according to claim 20, wherein a width of the thick frame is smaller than 1 mm.

22. A method of producing a semiconductor device according to claim 18, wherein each of the sloped side walls has a specific inclination.

23. A method of producing a semiconductor device from a semiconductor wafer by dicing, the method comprising:
   forming a plurality of grooves each having sloped side walls on a back face of the semiconductor wafer;
   attaching the back face of the semiconductor wafer to a self-adhesive sheet; and
   cutting the semiconductor wafer into the semiconductor device along the plurality of grooves from a side opposite to the back face of the semiconductor wafer by dicing utilizing a dicing blade, the dicing blade having side faces passing through the sloped side walls of the plurality of grooves, wherein the semiconductor wafer is a (100) single-crystal silicon wafer; and wherein each of the plurality of grooves has {111} planes on the sloped side wall thereof.

24. A method of producing a semiconductor device according to claim 23, wherein the plurality of grooves are formed by anisotropic etching.

25. A method of producing a semiconductor device according to claim 23, wherein:

the semiconductor device is a semiconductor sensor including a (100) single crystal silicon substrate, a thin portion formed above the substrate, and strain gauges formed on the thin portion; and the thin portion is formed together with the plurality of grooves on the semiconductor wafer by etching.

26. A method of producing a semiconductor device from a semiconductor wafer by dicing, the method comprising:

forming a groove having a sloped side wall on a first surface of the semiconductor wafer, the sloped side wall having a specific inclination relative to the back face of the semiconductor wafer; and cutting the semiconductor wafer along the groove by a dicing blade from a second surface opposite to the first surface of the semiconductor wafer so that the dicing blade passes through the sloped side wall in a direction which is approximately perpendicular to the back face of the semiconductor wafer and forms an obtuse angle with the sloped side wall on a second surface side.

27. A method of producing a semiconductor device according to claim 26, further comprising attaching the first surface of the semiconductor wafer to a self-adhesive sheet before cutting the semiconductor wafer.

28. A method of producing a semiconductor device according to claim 26, wherein:

the semiconductor wafer is a (100) single crystal silcon wafer; and the groove is formed to have the sloped side wall parallel to a {111} plane of the (100) single crystal silicon wafer.

29. A method of producing a semiconductor device according to claim 28, wherein the groove is formed by anisotropically etching the first surface of the semiconductor wafer.

30. A method of producing a semiconductor device from a semiconductor wafer by dicing, the method comprising:

anisotropically etching a back face of the semiconductor wafer to form a plurality of grooves, the plurality of grooves each having sloped side walls;

attaching the back face of the semiconductor wafer to a self-adhesive sheet; and cutting the semiconductor wafer into the semiconductor device along the plurality of grooves from a face opposite to the back face of the semiconductor wafer by dicing utilizing a dicing blade, the dicing blade having side faces passing through the sloped side walls of the plurality of grooves, wherein:

the semiconductor device is a semiconductor sensor including a substrate, a thin portion formed on the substrate, and strain gauges formed on the thin portion; and the thin portion is formed by anisotropically etching the back face of the semiconductor wafer together with the plurality of grooves.

31. A method of producing a semiconductor device according to claim 30, wherein:

the semiconductor sensor includes a thick frame formed on the substrate; and the thick frame is bonded to a base through adhesives after the semiconductor wafer is divided into the semiconductor device.

32. A method of producing a semiconductor device according to claim 31, wherein a width of the thick frame is smaller than 1 mm.

* * * * *